US006072285A

United States Patent [19]

Chen

[11] Patent Number: 6,072,285
[45] Date of Patent: Jun. 6, 2000

[54] SOFT STARTER DEVICE FOR LAMPS

[75] Inventor: Eric Chen, Taipei, Taiwan

[73] Assignee: Pro Up Tech Co., Ltd., Taipei, Taiwan

[21] Appl. No.: 09/247,661

[22] Filed: Feb. 10, 1999

[30] Foreign Application Priority Data

Oct. 26, 1998 [CN] China .................................. 87217699

[51] Int. Cl.[7] ........................................ G03F 1/00

[52] U.S. Cl. .................................... 315/307; 315/DIG. 5; 315/94; 315/209 R; 315/106

[58] Field of Search ............................... 315/209 R, 219, 315/224, 225, 244, 276, 291, 94, DIG. 5, DIG. 7, 106, 307

[56] References Cited

U.S. PATENT DOCUMENTS

| | | | |
|---|---|---|---|
| 5,363,020 | 11/1994 | Chen et al. | 315/209 R |
| 5,461,286 | 10/1995 | Hirschmann | 315/205 |
| 5,543,690 | 8/1996 | Bernicke et al. | 315/224 |
| 5,854,538 | 12/1998 | Krummel | 315/105 |
| 5,932,974 | 8/1999 | Wood | 315/119 |

*Primary Examiner*—Don Wong
*Assistant Examiner*—Tuyet Thi Vo
*Attorney, Agent, or Firm*—Merchant & Gould P.C.

[57] ABSTRACT

The invention provides a soft starter device for lamps. The soft starter device includes a rectifying circuit for converting an AC voltage into a DC voltage which serves as a triggering signal; a high frequency voltage generating circuit for generating a high frequency voltage by an oscillation between two transistors; a high frequency output transformer electrically connected to the high frequency voltage generating circuit and having a primary coil and a secondary coil; a first capacitor for providing a momently high voltage to a lamp tube by generating a resonance together with the high frequency output transformer; and a control circuit having a charging circuit and a switch for grounding the secondary coil connected thereto or allowing the secondary coil to function normally. At the initial time of power supplying, the switch is turned on to ground the secondary coil, causing the primary coil being not able to function, such that only a current flows into the lamp tube to preheat the filaments thereof. After a short charging time, the switch is turned off to allow the primary coil and the secondary coil to function normally, so that the first capacitor provides a high voltage to start the lamp tube by generating a resonance together with the high frequency output transformer.

6 Claims, 4 Drawing Sheets

SOFT STARTER DEVICE FOR LAMPS

BACKGROUND OF THE INVENTION

1. Field of the Invention

The invention relates to a soft starter device, and in particular to a soft starter device for lamps function according to a similar lumination theory, such as fluorescent lamps, electricity-saving bulbs, mercury-vapor lamps or the like.

2. Description of the Related Art

In a theory of a conventional starting lamp such as fluorescent lamp, an electronic stabilizer is used to start the fluorescent lamp tube with a high voltage and a high current generated due to a high frequency oscillation. At starting, voltage difference between both ends of the fluorescent lamp rapidly increases to a momently high voltage of more than 1,000V, thereby starting the lamp tube. If the filaments of the lamp tube are not preheated, a momently high voltage of over 2,000V is required for starting. As a result, the filaments of the fluorescent lamp must momently withstand a high voltage of more than 1,000V, causing inactive ions created by the preheated filaments to evenly emit to forcedly light up the lamp tube, such that the filaments are speedily oxidized, damaged, aged. Consequently, the life of service of the lamp is reduced. Furthermore, after the fluorescent lamp is discarded, a great amount of mercury filled therein will cause a problem of environment pollution.

To increase the life time of fluorescent lamps used, a conventional method uses a frequency-changing circuit to lower frequency before generating a high voltage, thereby generating a lower voltage instead of the high voltage. At the same time, a lower current flows through filaments for preheating. After a period of time, a high voltage is generated to light up a fluorescent lamp tube. Obviously, a disadvantage of the conventional method is that both the voltage and current are constrained, leading to a poor preheating. On the other hand, since a lamp comprises a plurality of fluorescent lamp tubes of different minimum voltages required for lighting Lil themselves, it is possible that some of the fluorescent lamp tubes will be forcedly lighted up at a lower-voltage condition without being preheated. Since the conventional frequency-changing soft starter device cannot completely stop a voltage input during a filament is preheated, some fluorescent lamp tubes will be lighted up and thus short life time of the tubes cannot be fully prevented.

SUMMARY OF THE INVENTION

In view of the above, the invention is to provide a soft starter device which does not provide any voltage to start a fluorescent lamp tube and does not constraint a current during a filament is preheated. Moreover, the soft starter device not only has fewer electronic elements, a simplified structure and better efficiency, but also can be widely applied to a multi-tube fluorescent lamp.

An object of the invention is to provide a soft starter device in which a secondary coil is grounded at the initial time power is supplied to temporarily disable a primary coil coupled thereto so that no voltage is input to the primary coil. At this point, a current coming from a high frequency generating circuit flows into a lamp tube or bulb to preheat the tube or bulb. After a period of time, a normal voltage is supplied, thereby increasing the life time of the lamp tube or bulb.

Another object of the invention is to provide a high efficiency and low cost soft starter device which is adapted to start multiple lamp tubes or bulbs at the same time.

BRIEF DESCRIPTION OF THE DRAWINGS

The invention will be more fully understood from the detailed description given hereinbelow and the accompanying, drawings which are given by way of illustration only, and thus do not limit the present invention, and wherein.

DETAILED DESCRIPTION OF THE PREFERRED EMBODIMENTS

Figure 1:
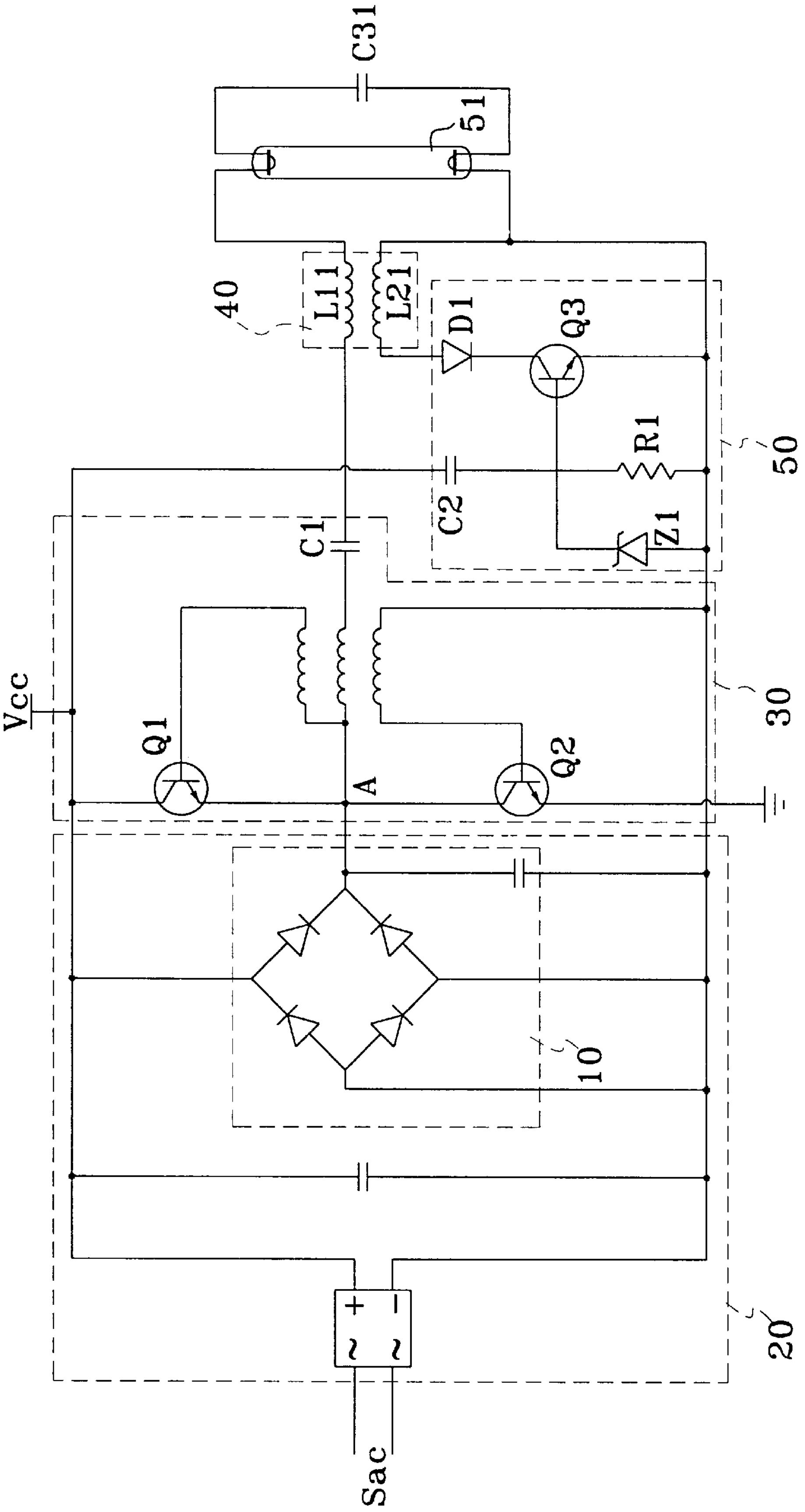
FIG. 1 is a circuit diagram showing a soft starter device according to a first embodiment of the invention.

FIG. 1 is a circuit diagram showing a soft starter device according to a first embodiment of the invention. As shown in FIG. 1, the soft starter device includes a rectifying circuit 20, a high frequency voltage generating circuit 30, a high frequency output transformer 40, a first capacitor C31 and a control circuit 50. The rectifying circuit 20 is electrically connected to an AC power source Sac, and has a rectifying bridge circuit 10 which is used to convert an AC voltage to a DC voltage output from a node A, thereby providing a triggering signal to the high frequency voltage generating circuit 30. The high frequency generating circuit 30 is electrically connected to the rectifying circuit 20, and has two transistors Q1 and Q2 which generate a high frequency AC voltage by an oscillation therebetween. The high frequency AC voltage is output to the high frequency output transformer 40 via an output capacitor C1. The high frequency output transformer 40 is electrically connected to the output capacitor C1 of the high frequency voltage generating circuit 30 and includes a primary coil L11 and a secondary coil L21 magnetically coupled to each other. One terminal of the primary coil L11 is electrically connected to one terminal of the output capacitor C1. The other terminal of the primary coil L11 and one terminal of the secondary coil L21 are electrically connected to both ends of a fluorescent lamp tube 51. In addition, the first capacitor C31 is electrically connected to both ends of the fluorescent lamp tube 51. Together, the first capacitor C31 and the high frequency output transformer 40 constitute an LC resonant circuit which generates a high voltage to light up the lamp tube 51.

At the initial time of power is supplied from the AC power source Sac, an LC resonance cannot be created by the high frequency output transformer 40 and the first capacitor C31, because part of a charging current flows through a charging circuit consisting of a capacitor C2 and a resistor R1 of the control circuit 50 from a DC source Vcc, to the base of a prower transistor Q3 to turn it oil. A Zener diode Z1 having a function of stablizing voltage is used to protect the transistor Q3 from damage. After the transistor Q3 is turned on, the potential of one terminal of the secondary coil L21 is pulled down to approximately ground potential, that is, the secondary coil is grounded. At this time, the primary coil L11 magnetically coupled to the secondary coil L21 has a magnetic induction down from 2 mH to about $10^{-2}$ mH. For this reason, an LC resonance cannot be formed by the high frequency output transformer 40 and the first capacitor C31. As a result, no high voltage is supplied to the fluorescent lamp tube 51. However, a current output from the capacitor C1 of the high frequency voltage generating circuit 30 flows into the fluorescent lamp tube 51 through the primary coil L11 to preheat the filaments of the tube 51. In an earlier phase in which power is supplied, no voltage is input into the primary coil L11 and only a current is input into the tube 51 to preheat it. Meanwhile, the primary coil L11 has a small amount of inductance (about $10^{-2}$ mH) and thus is not completely short circuited. Accordingly, mercury (not shown) contained in the fluorescent lamp tube 51 can be prevented from dramatic volatilization which blacken the florescent lamp tube 51. Moreover, the charging current flowing through the RC charging circuit is increasingly decreased in line with an increase of a charging time. After the charging time reaches about 1.5 sec, the charging current becomes small enough being unable to drive the transistor Q3. In other words, the transistor Q3 is turned off to allow the high frequency output transformer 40 to function normally and to create an LC resonance together with the first capacitor C31. At this moment, a high voltage is generated and provided to light up the fluorescent lamp tube 51.

Compared to the prior art, the soft starter device of the invention does not inhibit the preheating current, resulting in a better preheating efficiency. Additionally, since no voltage is provided to the fluorescent lamp tube during the preheating period, the fluorescent lamp tube cannot be forcedly lit up. Therefore, the life time of the fluorescent lamp tube call be efficiently extended.

Figure 2:
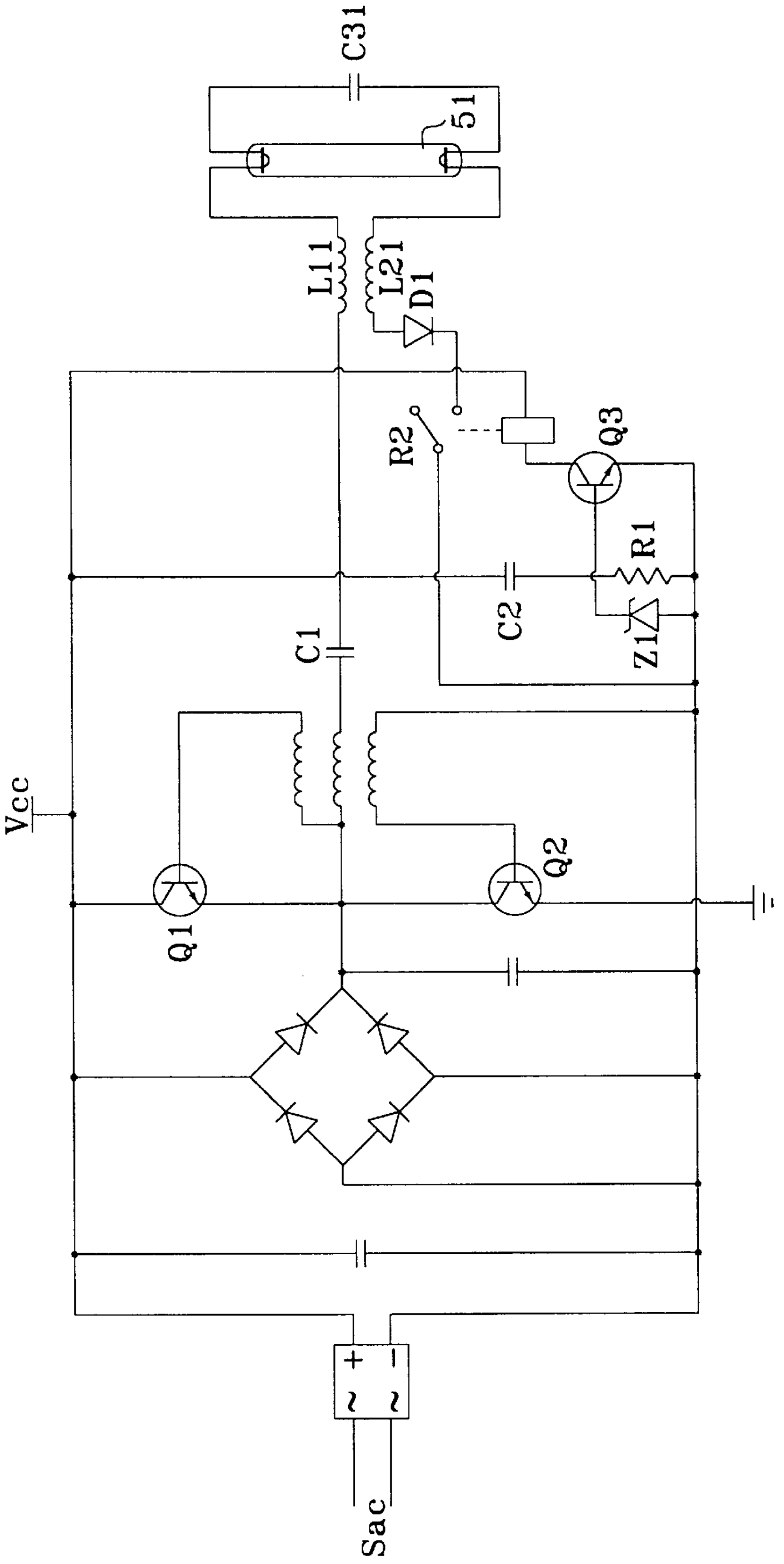
FIG. 2 is a circuit diagram showing a soft starter device according to a second embodiment of the invention.

FIG. 2 is a circuit diagram showing a soft starter device according to a second embodiment of the invention. Unlike the first embodiment shown in FIG. 1, whether a power transistor Q3 is turned on is used to determined whether a high voltage is provided to the tube 51. According to the second embodiment of the invention, a relay R2 and the small power transistor Q3 are used to determine whether a high voltage is provided to a fluorescent lamp tube 51. The operation of generating the high voltage shown in FIG. 2 is the same as that shown in FIG. 1, and is not be described here. How the high voltage is provided to the fluorescent lamp tube will be described hereinafter. When a current flows through a charging circuit comprising a capacitor C2 and a resistor R1 for charging the capacitor C2, part of the charging current turns on the small power transistor Q3 to pull the switch of the relay R2 downwards. At this time, a secondary coil L21 is grounded through a diode D1, causing a primary coil L11 to be disabled. Under this circumstance, only an output current coming from a capacitor C1 flows into the fluorescent lamp tube 51 to preheat a filament. After a period of charging time, the charging current becomes too small to drive the transistor Q3. In other words, the transistor Q3 is turned off at this time to release the switch of the relay R2 to allow the primary coil L11 and the secondary coil L21 to return to a normal condition. As a result, an LC resonance can be created by the primary and secondary coils L11, L21 and the first capacitor C31, thereby providing a high voltage to start the fluorescent lamp tube 51. As described above, a switch used to control whether a high voltage is provided to a fluorescent lamp tube is not limited to only one type. For example, a temperature switch can also be used to control whether the high voltage is provided to the fluorescent lamp tube by sensing the temperature variation of electronic elements during a period of charging time.

Figure 3:
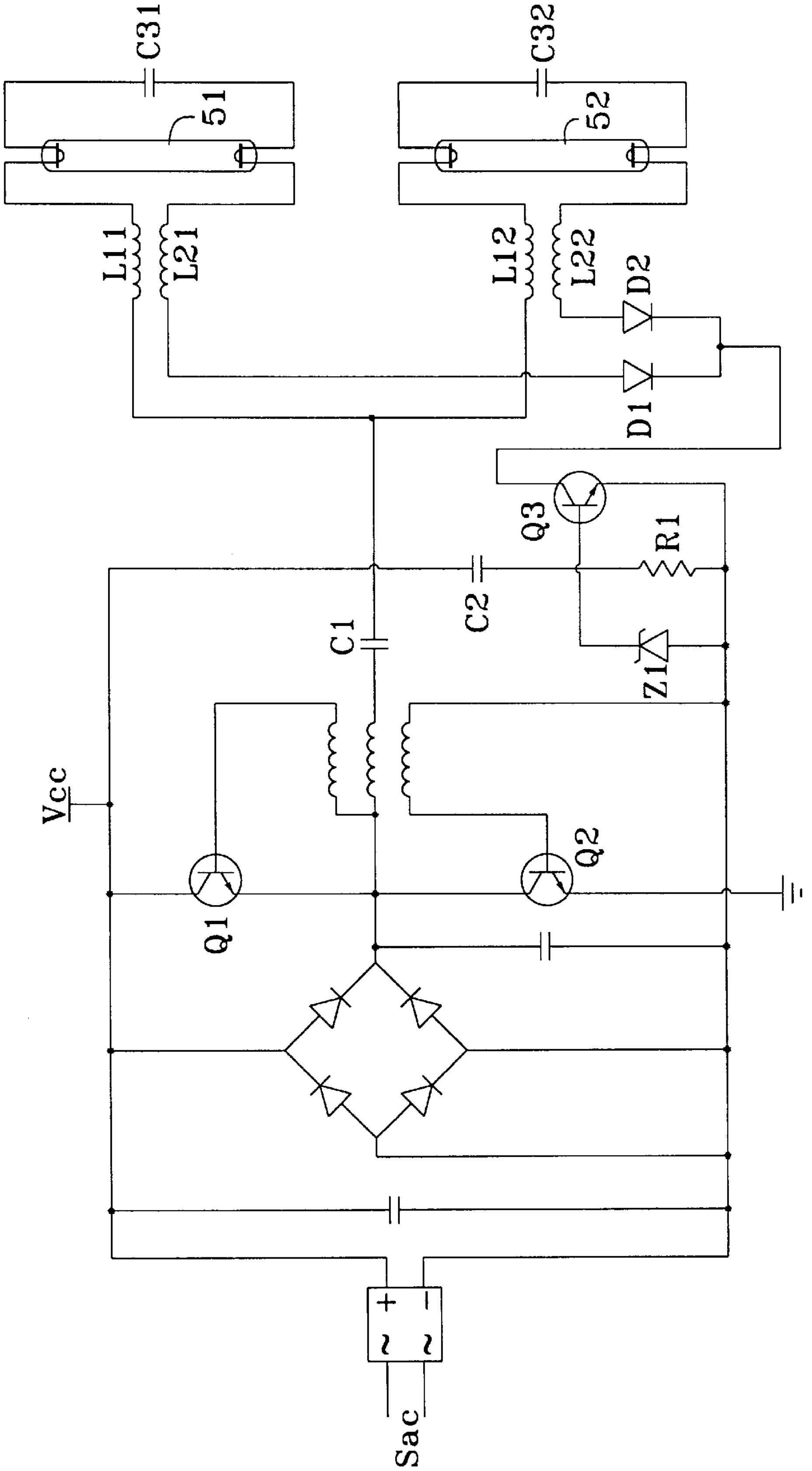
FIG. 3 is a Circuit diagram showing a soft starter device according to a third embodiment of the invention.

FIG. 3 is a circuit diagram showing a soft starter device according to a third embodiment of the invention. As shown in FIG. 3, a first LC resonant circuit is formed by a primary coil L11, a secondary coil L21 and a first capacitor C31 for a first fluorescent lamp tube 51. A power transistor Q3 is electrically connected to the secondary coil L21 through a diode D1 for controlling, whether a high voltage is provided to the first fluorescent lamp tube 51. A second LC resonant circuit is formed by a primary coil L12, a secondary coil L22 and a second capacitor C32 for a secondary fluorescent lamp tube 52. The power transistor Q3 is electrically connected to the secondary coil L22 through a diode D2 for controlling whether a hill voltage is provided to the second fluorescent lamp tube 52.

Figure 4:
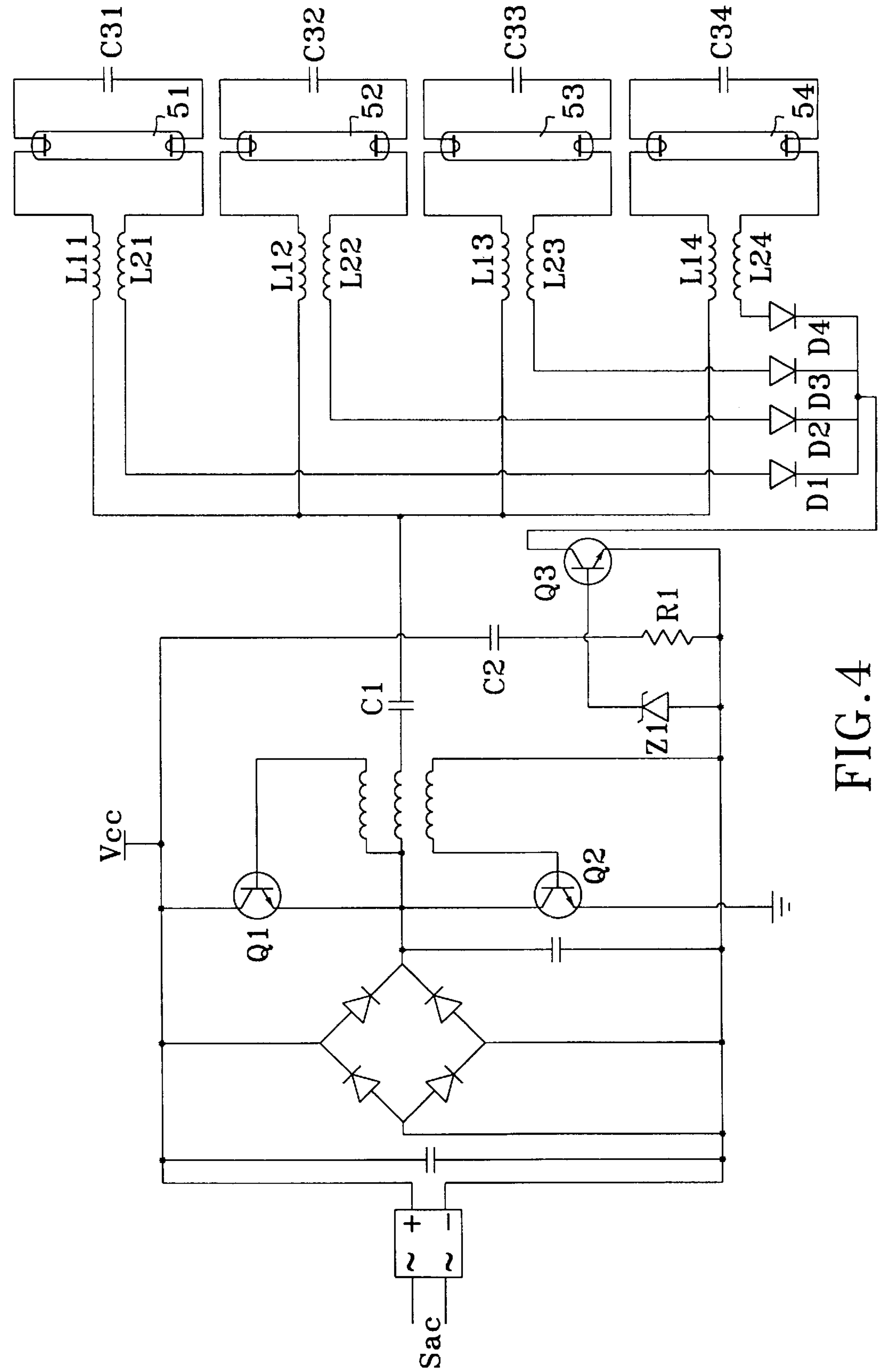
FIG. 4 is a circuit diagram showing a soft starter device according to a fourth embodiment of the invention.

FIG. 4 is a circuit diagram showing a soft starter device having four fluorescent lamp tubes according to a fourth embodiment of the invention. As shown in FIG. 4, diodes D1, D2, D3 and D4 are electrically connected to secondary coils L21, L22, L23 and L24, respectively, for controlling whether a high voltage is provided to fluorescent lamp tubes 51, 51, 52 and 54. Moreover, the operation of the soft starter device of the fourth embodiment is the same as those of the other embodiments stated above. As can be obviously seen from FIGS. 3 and 4, the soft starter device of the invention is suitable for a plurality of fluorescent lamp tubes without changing the main structure thereof.

While the invention has been described by way of example and in terms of the preferred embodiment, it is understood that the invention is not limited to the disclosed embodiments. To the contrary, it is intended to cover various modifications and similar arrangements within the scope and spirit of the invention as would be apparent to those skilled in the art. For example, a transistor Q3 serving as a switch can be replaced by a traditional temperature switch, and a diode D1 for protection can be omitted. Therefore, the scope of the appended claims should be accorded the broadest interpretation so as to encompass all such modifications and similar arrangements.

What is claimed is:

1. A soft starter device for lamps comprising:

a rectifying( circuit electrically connected to ain AC power source for converting an AC voltage into a DC voltage which servers as a triggering signal;

a high frequency voltage generating circuit electrically connected to the rectifying circuit and having two transistors and an output capacitor for generating a high frequency voltage, a high frequency output transformer electrically connected to the high frequency voltage generating circuit and having a primary coil and a secondary coil magnetically coupled to each other, wherein one terminal of the primary coil is electrically connected to one terminal of the output capacitor, and the other terminal of the primary coil and one terminal of the secondary coil are electrically connected to both ends of a lamp tube;

a first capacitor electrically connected to both ends of the lamp tube for supplying a momently high voltage to start the lamp tube by generating a resonance together with the high frequency output transformer;

a control circuit electrically connected to the other terminal of the secondary coil and having a charging circuit and a switch, wherein the charging circuit provides a charging current to turn the switch so as to ground the secondary coil which is electrically connected to the switch at the initial time of current supply by the AC power supply, at this time, the primary coil cannot function normally, such that a current flows from the output capacitor to the lamp tube to preheat the filaments thereof, and the switch is turned off after a charging time to allow the secondary coil to function normally, thereby generating a resonance together with the first capacitor to smoothly start the lamp tube.

2. The soft starter device as set forth in claim 1, wherein the output current of the high frequency voltage generating circuit for preheating the filaments of the lamp tube is not inhibited.

3. The soft starter device as set forth in claim 1, wherein the high frequency output transformer does not provide any voltage to the lamp tube when the filaments are preheated by the output current of the high frequency voltage generating circuit.

4. The soft starter device as set forth in claim 1, wherein the switch is a transistor.

5. The soft starter device as set forth in claim 1, wherein the switch comprises a relay and a transistor.

6. The soft starter device as set forth in claim 1, wherein the switch is a temperature switch.

* * * * *